United States Patent
Lee et al.

(10) Patent No.: US 12,094,730 B2
(45) Date of Patent: *Sep. 17, 2024

(54) ASYMMETRICAL SEALING AND GAS FLOW CONTROL DEVICE

(71) Applicant: SAMSUNG ELECTRONICS CO., LTD., Suwon-si (KR)

(72) Inventors: June Hee Lee, Hwaseong-Si (KR); Young Jong Yoon, Hwaseong-Si (KR); Seok Heon Yu, Hwaseong-Si (KR); Pill Kyu Jin, Hwaseong-Si (KR); Jeong Woo Woo, Hwaseong-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 199 days.

This patent is subject to a terminal disclaimer.

(21) Appl. No.: 17/644,028

(22) Filed: Dec. 13, 2021

(65) Prior Publication Data

US 2022/0102168 A1   Mar. 31, 2022

Related U.S. Application Data

(63) Continuation of application No. 16/053,203, filed on Aug. 2, 2018, now Pat. No. 11,276,585.

(30) Foreign Application Priority Data

Jan. 30, 2018  (KR) ........................ 10-2018-0011597

(51) Int. Cl.
*H01L 21/67* (2006.01)
*C23C 16/44* (2006.01)
(Continued)

(52) U.S. Cl.
CPC .... *H01L 21/67017* (2013.01); *C23C 16/4412* (2013.01); *C23C 16/45591* (2013.01);
(Continued)

(58) Field of Classification Search
CPC ......... H01L 21/67017; H01L 21/68735; H01L 21/68742; H01L 21/67126; H01L 21/6719;
(Continued)

(56) References Cited

U.S. PATENT DOCUMENTS 6,257,168 B1   7/2001  Ni et al.
6,402,847 B1   6/2002  Takagi et al.
(Continued)

FOREIGN PATENT DOCUMENTS

JP   2000-223429   8/2000
KR   1020040050079   6/2004
(Continued)

*Primary Examiner* — Jeffrie R Lund
(74) *Attorney, Agent, or Firm* — F. Chau & Associates, LLC

(57) ABSTRACT

A sealing device configured for use in a vacuum chamber between a reaction region of the vacuum chamber and an exhaust port includes a ring-shaped body with an upper surface and a lower surface. A distance between the upper surface and the lower surface of the sealing device is a thickness of the ring-shaped body. The thickness of the ring-shaped body differs along a circumference of the ring-shaped body such that the ring-shaped body has a wedge shape. The thickness of the ring-shaped body, around its circumference is dependent upon a structure of the exhaust port.

16 Claims, 11 Drawing Sheets

(51) Int. Cl.
*C23C 16/455* (2006.01)
*F16K 1/34* (2006.01)
*H01L 21/687* (2006.01)
*C23C 16/458* (2006.01)
*H01J 37/32* (2006.01)

(52) U.S. Cl.
CPC ............ *F16K 1/34* (2013.01); *H01L 21/6719*
(2013.01); *H01L 21/68735* (2013.01); *C23C 16/45565* (2013.01); *C23C 16/4585* (2013.01);
*H01J 37/32449* (2013.01); *H01J 37/32513* (2013.01); *H01J 37/32834* (2013.01); *H01L 21/68742* (2013.01)

(58) Field of Classification Search
CPC .......... F16K 25/005; F16K 51/02; F16K 1/42; F16K 1/34; H01J 37/32449; H01J 37/32834; H01J 37/32513; C23C 16/45591; C23C 16/45565; C23C 16/4412; C23C 16/4585; C23C 16/4583
See application file for complete search history.

(56) References Cited

U.S. PATENT DOCUMENTS

| | | | |
|---|---|---|---|
| 6,524,026 B2 | 2/2003 | Sondrup | |
| 7,037,376 B2 | 5/2006 | Harvey et al. | |
| 7,648,610 B2 | 1/2010 | Komiya et al. | |
| 7,651,568 B2 | 1/2010 | Ishizaka et al. | |
| 7,867,366 B1 | 1/2011 | Tong et al. | |
| 8,163,087 B2 | 4/2012 | Faguet et al. | |
| 8,454,027 B2 | 6/2013 | Povolny et al. | |
| 8,454,749 B2 | 6/2013 | Li | |
| 9,005,539 B2 | 4/2015 | Halpin et al. | |
| 9,340,874 B2 | 5/2016 | Halpin et al. | |
| 9,963,782 B2 * | 5/2018 | Tsuji ................. | H01J 37/32091 |
| 10,103,018 B2 | 10/2018 | Kim et al. | |
| 10,655,224 B2 * | 5/2020 | Agarwal ............. | C23C 16/4581 |
| 11,276,585 B2 * | 3/2022 | Lee ............................ | F16K 1/34 |
| 2003/0051665 A1 | 3/2003 | Zhao et al. | |
| 2003/0094135 A1 | 5/2003 | Komiya et al. | |
| 2003/0221780 A1 | 12/2003 | Lei et al. | |
| 2005/0224180 A1 | 10/2005 | Bera et al. | |
| 2010/0081284 A1 | 4/2010 | Balakrishna et al. | |
| 2011/0126884 A1 | 6/2011 | Kang et al. | |
| 2011/0126984 A1* | 6/2011 | Kang ................. | H01J 37/32642 156/345.51 |
| 2012/0135609 A1 | 5/2012 | Yudovsky et al. | |
| 2013/0000568 A1 | 1/2013 | Hara et al. | |
| 2014/0130743 A1 | 5/2014 | Toriya et al. | |
| 2016/0162170 A1 | 6/2016 | Brou et al. | |
| 2018/0122633 A1 | 5/2018 | Leeser | |
| 2018/0171473 A1 | 6/2018 | Agarwal et al. | |
| 2019/0203353 A1 | 7/2019 | Jeon et al. | |
| 2019/0237344 A1 | 8/2019 | Lee et al. | |
| 2022/0102168 A1* | 3/2022 | Lee ........................... | F16K 1/34 |

FOREIGN PATENT DOCUMENTS

| | | |
|---|---|---|
| KR | 20130125528 | 11/2013 |
| KR | 20140091766 | 7/2014 |

* cited by examiner

ASYMMETRICAL SEALING AND GAS FLOW CONTROL DEVICE

CROSS-REFERENCE TO RELATED APPLICATION

This U.S. non-provisional patent application is a continuation of co-pending U.S. patent application Ser. No. 16/053,203, filed on Aug. 2, 2018, which claims priority under 35 U.S.C. § 119 to and the benefit of Korean Patent Application No. 10-2018-0011597, filed on Jan. 30, 2018, in the Korean Intellectual Property Office (KIPO), the disclosures of which are herein incorporated by reference in their entirety.

TECHNICAL FIELD

The present disclosure relates to a sealing device and, more specifically, to an asymmetrical sealing and gas flow control device.

DISCUSSION OF RELATED ART

Semiconductor fabrication processes may often utilize a substrate processing apparatus that includes a vacuum chamber in which a deposition process, an etching process, an annealing process, etc. may be performed. Process gas is generally supplied into a reaction region of the substrate processing apparatus, and an exhaust passage is used to lead the process gas out of the reaction region and out through an exhaust port. The process gas is moved from the reaction region to the exhaust passage due to an exhaust pressure present at the exhaust port. The reaction region is formed between a gas distribution plate, which is an upper part, and a substrate, which is a lower part. A sealing member, for preventing the process gas from moving to a lower region of the vacuum chamber, is disposed outside of the substrate. A gap is formed between the sealing member and the gas distribution plate. The process gas in the reaction region moves to the exhaust passage through this gap.

The sealing member is generally flat and thin. While the process gas is moved by exhaust flow in the exhaust passage, the substrate in the reaction region is processed by the process gas. The manner in which the exhaust flow is formed is determined according to a position and a direction of the exhaust port, a shape of the exhaust passage, and a position in the exhaust passage. The exhaust flow may become asymmetrical due to a structure of the semiconductor equipment. When asymmetrical exhaust flow is generated, a substrate processing result may also have an asymmetrical characteristic. In such a case, the result of processing the substrate becomes uneven.

SUMMARY OF THE INVENTION

A sealing device configured for use in a vacuum chamber between a reaction region of the vacuum chamber and an exhaust port includes a ring-shaped body with an upper surface and a lower surface. A distance between the upper surface and the lower surface of the sealing device is a thickness of the ring-shaped body. The thickness of the ring-shaped body differs along a circumference of the ring-shaped body such that the ring-shaped body has a wedge shape. The thickness of the ring-shaped body, around its circumference is dependent upon a structure of the exhaust port.

An apparatus for controlling gas flow distribution includes a vacuum chamber having a chamber wall in which an exhaust port is formed and including a substrate supporting device, a gas distribution plate, and an exhaust passage contained therein. The substrate supporting device is configured to support a substrate, which is a processing target, and is disposed below the gas distribution plate. The gas distribution plate is disposed opposite to the substrate supporting device with a reaction region interposed therebetween, and is configured to supply a process gas to the reaction region. The exhaust passage is formed in the chamber wall of the vacuum chamber to surround the reaction region. A sealing device is disposed in an exhaust path in which the process gas is moved from the reaction region to the exhaust port via the exhaust passage. The sealing device has a ring-shaped body. An upper surface of the sealing device is a part of the exhaust path so that a gap is formed between the upper surface and the gas distribution plate. The sealing device has a thickness varying along a circumferential direction of the body according to a positional relationship with the exhaust port so that a width of the gap is controlled.

A sealing device configured for use in a vacuum chamber includes a ring-shaped body, disposed opposite to a gas distribution plate that is configured to supply a process gas to a reaction region of a vacuum chamber, in an exhaust path. The exhaust path is in communication with the reaction region and an exhaust passage. The ring-shaped body has a varying cross-sectional shape taken in a first reference plane, which contains an internal-diameter center axis of the body and at least one exhaust port of the vacuum chamber.

BRIEF DESCRIPTION OF THE DRAWINGS

A more complete appreciation of the present disclosure and many of the attendant aspects thereof will become more apparent by describing exemplary embodiments thereof in detail with reference to the accompanying drawings, in which.

DETAILED DESCRIPTION OF EXEMPLARY EMBODIMENTS

Figure 1:
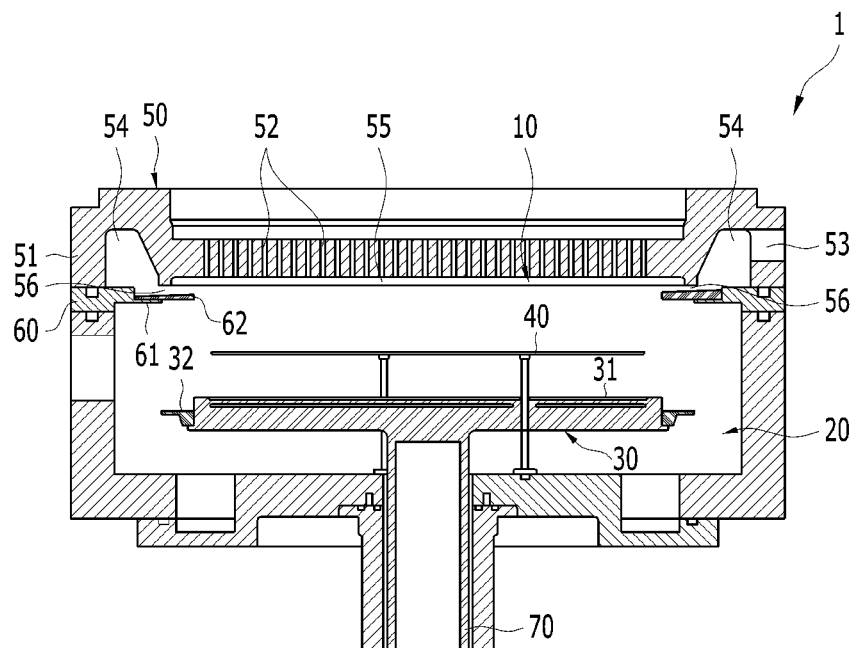
FIG. 1 is a cross-sectional view illustrating a substrate processing apparatus seen from a substrate loading/unloading position according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 2:
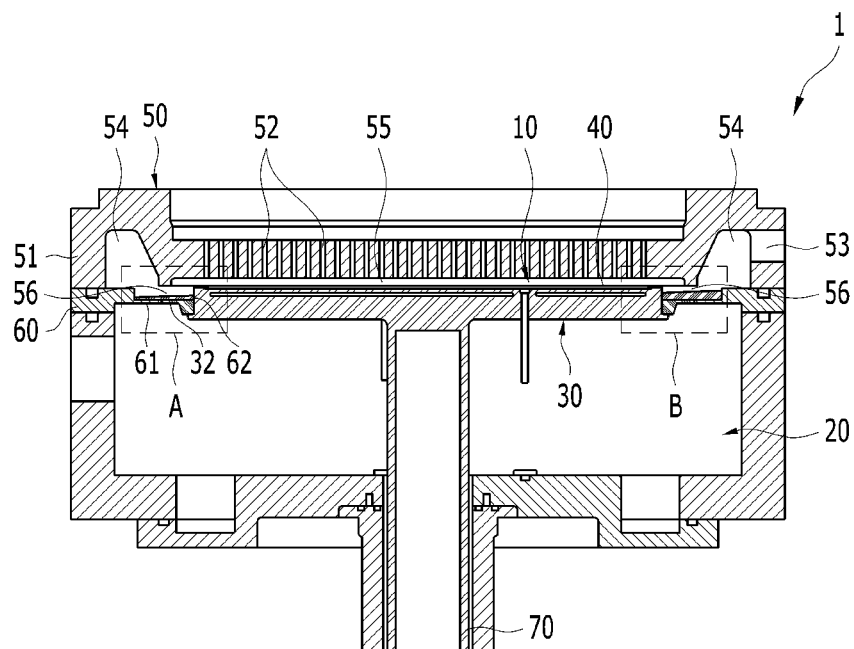
FIG. 2 is a cross-sectional view illustrating a substrate processing apparatus seen from a substrate processing position according to an exemplary embodiment of the present disclosure.

FIG. 1 is a cross-sectional view illustrating a substrate processing apparatus seen from a substrate loading/unloading position according to an exemplary embodiment of the present disclosure. FIG. 2 is a cross-sectional view illustrating a substrate processing apparatus seen from a substrate processing position according to an exemplary embodiment of the present disclosure.

A substrate processing apparatus, according to an exemplary embodiment of the present disclosure, may include a vacuum chamber 1. The vacuum chamber 1 may provide a sealed space so that processes may be performed upon a substrate 40 therein. The vacuum chamber 1 may have a cylindrical shape, a rectangular barrel shape, or some other suitable shape. The vacuum chamber 1 may be comprised of a metal, such as aluminum or stainless steel. In the vacuum chamber 1, various processes, such as chemical vapor deposition (CVD), plasma-enhanced chemical vapor deposition (PECVD), reactive ion etching (RIE), annealing, oxidation, nitridation, etc., may be performed in a vacuum atmosphere. The vacuum chamber 1 may include a gas inlet through which a source gas is supplied. An exhaust may be configured to discharge a reacted gas and a byproduct. A substrate holder may be configured to fix a substrate and control its position. A power source may be configured to supply energy required for a reaction, and the like.

Referring to FIG. 1, the substrate 40 is disposed at a loading/unloading position in the vacuum chamber 1. The vacuum chamber 1 may include an upper chamber 10 and a lower chamber 20. A support plate 60 may be disposed between the two chambers 10 and 20. The substrate 40 may be processed by a process gas in the upper chamber 10 and loaded/unloaded in the lower chamber 20.

The upper chamber 10 may include a gas distribution plate 50, an exhaust passage 54, and an exhaust port 53.

The gas distribution plate 50 may include a chamber wall 51 constituting a housing of the upper chamber 10, a gas distribution region disposed therein, and the exhaust passage 54 formed between the chamber wall 51 and the gas distribution region. The gas distribution plate 50 may be used as an upper electrode in a plasma process, and may include a metal and/or ceramic material. The gas distribution plate 50 may include a metal, such as aluminum, aluminum alloys, steel, stainless steel, nickel, or nickel alloys (e.g. an INCONEL® alloy, which are alloys produced under the authority of Huntington Alloys Corporation, or a HASTELLOY® alloy, which are alloys produced under the authority of Haynes International, Inc.), or a ceramic dielectric, such as $SiO_2$, $SiC$, $SiN$, $Al_2O_3$, $AlN$, or $Y_2O_3$. In an exemplary embodiment of the present disclosure, the gas distribution plate 50 may include a quantity of aluminum capable of producing sufficient corrosion resistance, reactivity, conductivity, processability, and the like.

The gas distribution plate 50 may be a showerhead used for spraying gas under the gas distribution plate 50. The gas distribution plate 50 may have a plurality of spray holes 52 formed in the gas distribution region through which has may be sprayed. The process gas may be transmitted from a gas supplier disposed on the gas distribution plate 50 to a reaction region 55 under the spray holes 52, and thereafter, the process gas may be sprayed through the spray holes 52. The process gas may be converted into plasma in the reaction region 55. The gas distribution plate 50 may be configured as an integrated type in which the spray holes 52 are set through an integrated part of the gas distribution plate 50 or as a separate type in which the spray holes 52 are set through a separate part of the gas distribution plate 50. Examples of the process gas may include chlorine, fluorine, an inert gas (such as $NF_3$, $C_2F_6$, $CF_4$, COS, $SF_6$, $Cl_2$, $BCl_3$, $C_2HF_5$, $N_2$), Ar and He, $H_2$ and/or $O_2$.

The exhaust passage 54 may have a circular shape that surrounds the reaction region 55 inside the chamber wall 51 that defines a periphery of the gas distribution plate 50. The exhaust passage 54 may communicate with the reaction region 55 formed inside the vacuum chamber 1.

The exhaust port 53 may be formed to pass through a portion of the chamber wall 51 and may be connected to a portion of the exhaust passage 54. The exhaust port 53 may be connected to a vacuum pump. At the exhaust port 53, a pressure control valve, a flow amount control valve, etc. may be installed. The vacuum pump may generate exhaust flow by decompressing the vacuum chamber 1 and thereby discharging the process gas, reaction byproducts, or the like from the vacuum chamber 1. A pressure in the vacuum chamber 1 may be controlled by adjusting an exhaust rate with an exhaust valve and the vacuum pump.

The exhaust port 53 may pass through the gas distribution plate 50. The exhaust port 53 may communicate with an upper portion of the vacuum chamber 1. The exhaust port 53 may communicate with the lower chamber 20 via the upper chamber 10. One or more exhaust ports 53 may be formed. The plurality of exhaust ports 53 may be disposed symmetrically or asymmetrically with respect to a center of the reaction region 55.

The lower chamber 20 may include a substrate supporting device 30, an elevation device 70, and a conveyance port.

The substrate supporting device 30 may have a disk shape and may be rotatable. The substrate supporting device 30 may be connected to the elevation device 70 that may move up and down in the vertical direction. The substrate supporting device 30 may be used as a lower electrode in a plasma process, and may include a metal or ceramic material. The substrate supporting device 30 may be grounded. The substrate supporting device 30 may be a susceptor in which a heater is installed to uniformly maintain a temperature of the substrate 40. A substrate supporting surface 31 for accommodating the substrate 40 may be in an upper surface of the substrate supporting device 30. A lower sealing member 32 may be disposed on a side surface of the substrate supporting device 30. The substrate supporting device 30 may be positioned below the gas distribution plate 50. The substrate supporting device 30 may have the substrate holder, which has a circular shape, and a stem connected to the bottom of the substrate holder. The substrate supporting device 30 may stably support the substrate while a process is performed on the substrate 40. The substrate supporting device 30 may include the heater for heating the substrate 40 inside a region of the substrate supporting device 30 corresponding to the substrate supporting surface 31 for supporting the substrate 40. The substrate supporting device 30 may maintain a temperature of the substrate 40 through the heater during the performance of the process. The substrate supporting device 30 may support the substrate 40 by electrostatically adsorbing the substrate 40.

The substrate supporting device 30 may include a metal, such as aluminum, aluminum alloys, steel, stainless steel, nickel, or nickel alloys (e.g. an INCONEL® alloy or a HASTELLOY® alloy), or a ceramic dielectric, such as $SiO_2$, SiC, SiN, $Al_2O_3$, AlN, or $Y_2O_3$.

The substrate 40 may be a silicon wafer. The substrate 40 may include glass or plastic such as a substrate that may be used for flexible display devices.

The support plate 60 may be disposed between the upper chamber 10 and the lower chamber 20 of the vacuum chamber 1. An upper sealing member 62 may be disposed on the support plate 60 inside the vacuum chamber 1. An edge of the support plate 60 protrudes to the inside of the vacuum chamber 1 to constitute a flange 61, and the upper sealing member 62 may be disposed on the flange 61. For example, at least an outer side surface 623 (see FIG. 3) or a part of a lower surface 622 (see FIG. 3) of the upper sealing member 62 may be in contact with the flange 61 and/or may be mounted on the flange 61.

Referring to FIG. 2, the substrate 40 is disposed in the reaction region 55 while being mounted on the substrate supporting device 30. The upper sealing member 62 disposed on the support plate 60 and the lower sealing member 32 disposed on the substrate supporting device 30 may be in contact with each other when the substrate supporting device 30 moves upward. The reaction region 55 may be formed when the gas distribution plate 50 and the substrate supporting device 30 come in contact with each other.

The upper sealing member 62 and the lower sealing member 32 may come in contact with each other and form a ring assembly. The upper sealing member 62 and the lower sealing member 32 come in contact with each other and are compressed between the support plate 60 and the substrate supporting device 30 such that an interface between the two parts 32 and 62 may be sealed. Also, the ring assembly may prevent the process gas from moving to the lower chamber 20 by sealing a gap between the upper chamber 10 and the lower chamber 20. Accordingly, the upper chamber 10 is vacuum-sealed, and it is possible to prevent the process gas in the reaction region 55 from deviating from an exhaust path and leaking out.

In the vacuum chamber 1, the gas distribution plate 50 and the substrate supporting device 30 are disposed with an interval therebetween so as to comprise a pair of parallel electrodes. The reaction region 55 may be formed between the pair of parallel electrodes. In the reaction region 55, a surface of the substrate 40 exposed to the reaction region 55 may be processed with the process gas.

Outside the reaction region 55, an upper surface 621 of the upper sealing member 62 and a lower surface of the gas distribution plate 50 may face each other with a gap 56 therebetween. The process gas in the reaction region 55 may be moved to the exhaust passage 54 through the gap 56. The exhaust port 53 is connected to the exhaust passage 54, and the vacuum pump is connected to the exhaust port 53, such that exhaust flow may be generated in the exhaust passage 54 (see FIGS. 7 to 11). A flow path of the process gas extending from the reaction region 55 to the exhaust passage 54 via the gap 56 is referred to as an exhaust path.

A method of processing the substrate 40 by using a substrate processing apparatus according to an exemplary embodiment of the present disclosure will be described below. The substrate 40 may be loaded into the lower chamber 20 of the vacuum chamber 1. At the loading/unloading position, the substrate 40 may be placed on the substrate supporting surface 31 of the substrate supporting device 30. The substrate supporting device 30 may be elevated by the elevation device 70 while accommodating the substrate 40. Due to an elevation of the substrate supporting device 30, the upper sealing member 62 fixed on the support plate 60 and the lower sealing member 32 fixed on the substrate supporting device 30 may come in contact with each other and form a ring assembly. In the reaction region 55, the gap between the upper chamber 10 and the lower chamber 20 may be sealed by the ring assembly. The substrate 40 may react with the process gas sprayed through the spray holes 52 of the gas distribution plate 50 or plasma generated in the reaction region 55.

The reaction region 55 communicates with the exhaust passage 54, and the exhaust passage 54 may be connected to the vacuum pump through the exhaust port 53 and the exhaust valve. Due to operation of the vacuum pump, exhaust flow may be generated in the exhaust passage 54. The process gas or the plasma may be discharged to the exhaust passage 54 via the gap 56 by the exhaust flow, after a reaction has occurred. The process gas in the exhaust passage 54 may be discharged out of the vacuum chamber 1 via the exhaust port 53. In this process, flow of the process gas in the reaction region 55 may be affected by exhaust flow in the exhaust passage 54. For example, when exhaust ports 53 are disposed asymmetrically with respect to the center of the exhaust passage 54, exhaust flow close to the exhaust ports 53 may be higher in speed and larger in amount than the exhaust flow farther from the exhaust ports 53. The process gas in the reaction region 55 communicating with the exhaust port 53 may be moved toward the exhaust passage 54 along adjacent exhaust flow in the exhaust passage 54. Due to the flow of the process gas moving from the reaction region 55 to the exhaust passage 54, diffusion of the process gas in the reaction region 55 may vary. For example, during a deposition process of a wafer, an edge region of the wafer is close to the gap 56 and thus may be affected by exhaust flow generated in the exhaust passage 54 via the gap 56. When the exhaust flow is asymmetrical, a layer thickness of the edge region of the wafer is also asymmetrical, and the layer thickness of the edge region may be larger than that of the center region. There are differences in speed and amount of exhaust flow between a portion of the exhaust passage 54 close to the exhaust port 53 and a portion farthest from the exhaust port 53 such that conditions for forming a layer may vary according to a distance from the exhaust port 53. For example, two points of the edge region at the same distance from the center of the wafer may have different layer thicknesses according to an amount and a speed of reactive gas passing through each of the two points.

Figure 3:
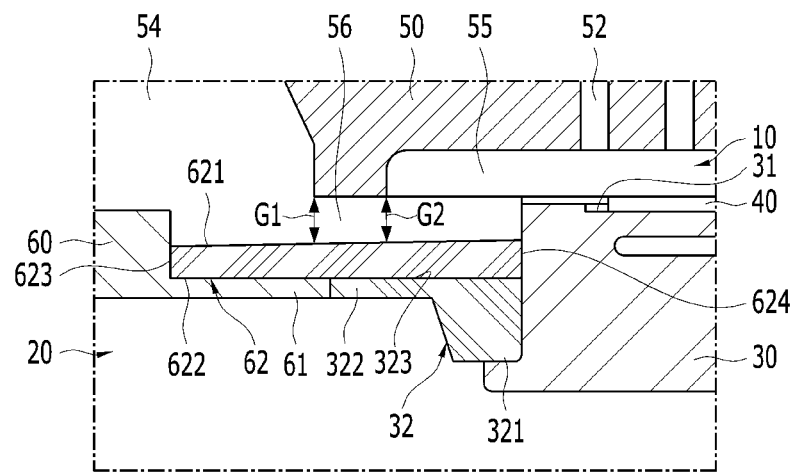
FIG. 3 is an enlarged cross-sectional view illustrating portion A of FIG. 2.

FIG. 3 is an enlarged cross-sectional view of portion A of FIG. 2. The exhaust port 53 may be formed on the opposite side of portion A. Referring to FIG. 3, at the substrate processing position, the reaction region 55 and the exhaust passage 54 may communicate with each other through the gap 56. The gap 56 may be defined by the upper surface 621 of the upper sealing member 62 and the lower surface of the gas distribution plate 50.

The lower sealing member 32 may have a ring-shaped body that surrounds the substrate supporting device 30. The lower sealing member 32 may be separably fixed on the side surface of the substrate supporting device 30. The lower sealing member 32 may have a cross section that has a support 321 fixed on the substrate supporting device 30 and a flange 322 protruding out from the support 321. An upper surface 323 of the flange 322 may be combined with the lower surface 622 of the upper sealing member 62 to seal the gap between the upper chamber 10 and the lower chamber 20.

The upper sealing member 62 may have a ring-shaped body, and may be disposed on the support plate 60 and the lower sealing member 32. The upper sealing member 62 may be in contact with an upper surface of the flange 61 of the support plate 60 and the upper surface 323 of the lower sealing member 32 respectively. The upper sealing member 62 may be separably fixed on the support plate 60.

The upper sealing member 62 may have a cross section including the lower surface 622, the outer side surface 623, an inner side surface 624, and the upper surface 621. The upper surface 621 of the upper sealing member 62, which defines a lower boundary of the gap 56, may be inclined outwardly along a diametral direction or a circumferential direction of the upper sealing member 62. For example, the gap 56 may have an outer width G1 larger than an inner width G2 and may have an inclination that slopes outwardly and downward. The inclination may be formed so that a thickness of the upper sealing member 62 continuously increases or decreases. As shown in the drawing, when a height of the upper surface 621 of the upper sealing member 62 is reduced outwardly, the gap 56 may widen. Accordingly, the process gas may be smoothly discharged from the reaction region 55 to the exhaust passage 54 via the gap 56. The outward inclination of the upper surface 621 of the upper sealing member 62 may be determined by a shape of the exhaust passage 54, a position of the exhaust port 53, a direction of the exhaust port 53, the number of exhaust ports 53, a shape and a position of the gap 56, a residence time of the process gas, the amount of exhausted process gas, and the like. The ring-shaped upper sealing member 62 may have an inner diameter of 300 mm or less and an outer diameter of 320 mm or more.

Each of the upper sealing member 62 and the lower sealing member 32 may be composed of quartz, alumina, aluminum, stainless steel, rutile, yttria, zirconia, an INCONEL® alloy, titanium, beryllium-copper, or other appropriate materials. In an exemplary embodiment of the present disclosure, the upper sealing member 62 and the lower sealing member 32 may increase or decrease in size according to a temperature in the vacuum chamber 1. For example, when the lower sealing member 32 is quartz and the temperature in the vacuum chamber 1 increases to approximately 400° C., the lower sealing member 32 may expand or grow. Due to the expansion or growth of the lower sealing member 32, a sealing function for a gap between the substrate supporting device 30 and the lower sealing member 32 may be increased, and self-centering of the lower sealing member 32 may be enabled.

Figure 4:
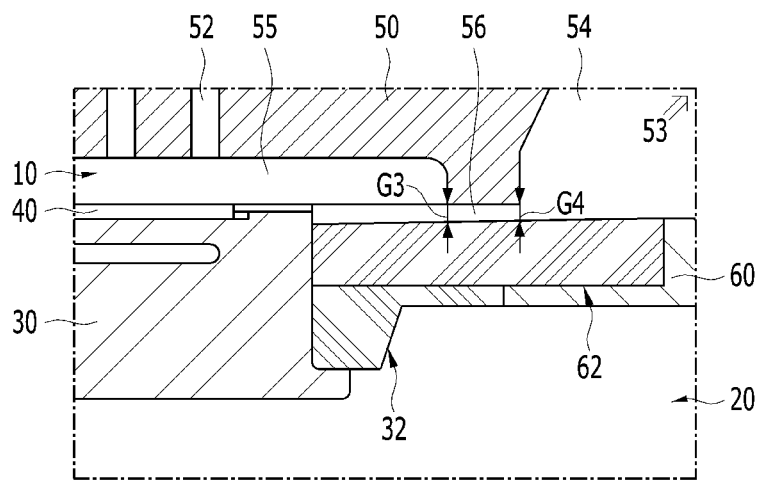
FIG. 4 is an enlarged cross-sectional view illustrating portion B of FIG. 2.

FIG. 4 is an enlarged cross-sectional view of portion B of FIG. 2. The exhaust port 53 may be formed on the side of portion B. Referring to FIG. 4, the upper sealing member 62 may have a cross-sectional shape different from that of the upper sealing member 62 of FIG. 3. For example, the lower sealing member 32 and the upper sealing member 62 may be symmetrical or asymmetrical shapes with respect to ring centers thereof. For example, the gap 56 between the upper sealing member 62 and the gas distribution plate 50 on the side close to the exhaust port 53 may have an outer width G4 smaller than an inner width G3 and may have an inclination that extends upwardly in an outward direction. Portion B close to the exhaust port 53 may have a higher speed and a larger amount of exhaust flow than those of exhaust flow in portion A that is farther from the exhaust port 53. As shown in the drawing, when the height of the upper surface 621 of the upper sealing member 62 increases outwardly, the gap 56 may be reduced. By reducing the gap 56, it is possible to control speed and amount of process gas discharged from the reaction region 55 to the exhaust passage 54 via the gap 56 so that the speed and the amount of process gas may be equal to those of A portion shown in FIG. 3.

Figure 5:
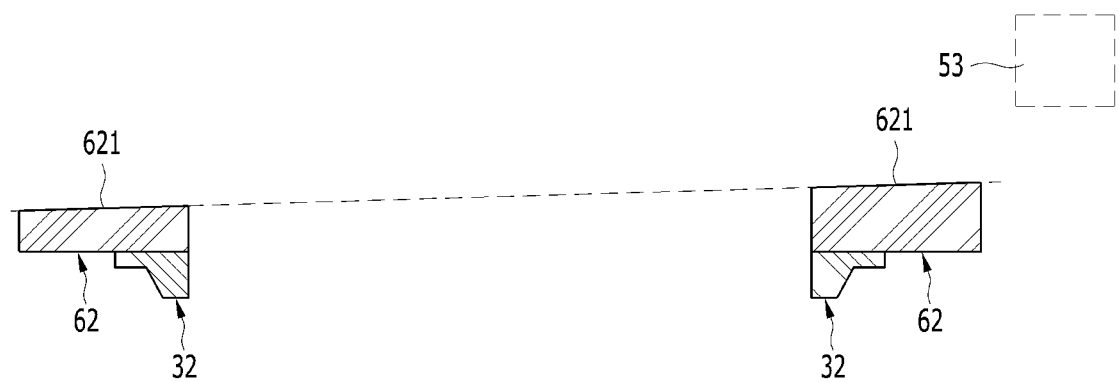
FIG. 5 is a cross-sectional view illustrating a ring assembly of FIG. 2.
Figure 6:
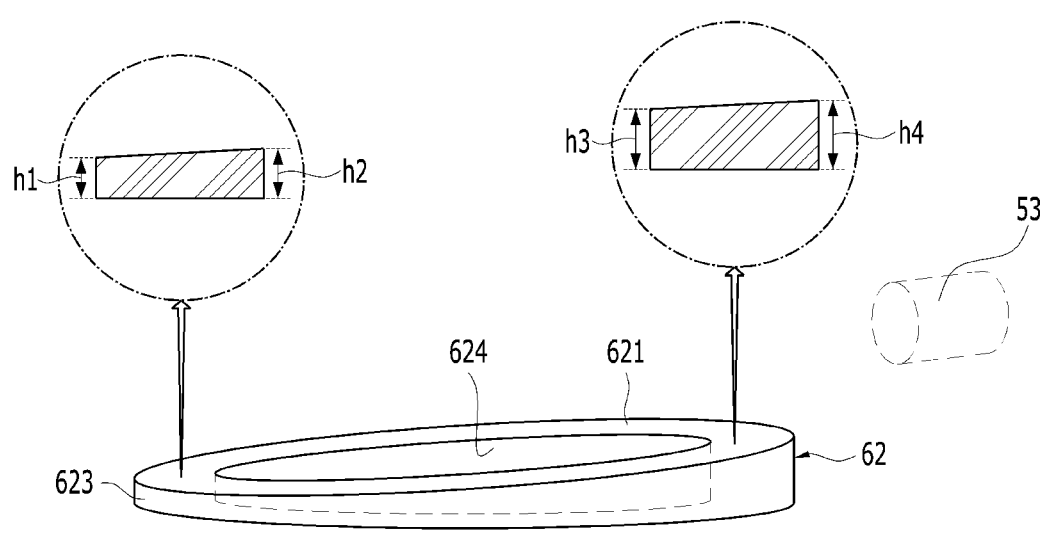
FIG. 6 is a perspective view and enlarged partial views of an upper sealing member of FIG. 5.

FIG. 5 is a cross-sectional view of the ring assembly of FIG. 2 obtained by combining the upper sealing member 62 and the lower sealing member 32 together, and FIG. 6 shows a perspective view and enlarged partial views of the upper sealing member 62 of FIG. 5. In FIGS. 5 and 6, one exhaust port 53 may be disposed in the vacuum chamber 1, and disposed on the right side in the drawings.

Referring to FIG. 5, a plane that contains a center axis of the ring assembly and is perpendicular to the ground may be defined as a reference plane. A cross section of the lower sealing member 32 taken in the reference plane may have a symmetrical shape. The reference plane may include one or more exhaust ports 53. A reference plane including one exhaust port 53 will be referred to herein as a first reference plane.

A cross section of the upper sealing member 62 taken in the first reference plane may have an asymmetrical shape with respect to the center axis of the ring assembly. For example, as indicated by a broken line, an inclined straight line may be present in the first reference plane and the inclined straight line may be inclined by a certain angle with respect to the ground. The upper surface 621 of the upper sealing member 62 disposed on the side of the exhaust port 53 (e.g. the right side in the drawing) and the upper surface 621 of the upper sealing member 62 disposed on the opposite side (e.g. the left side in the drawing) may be formed on the inclined line. For example, the upper sealing member 62 may have a thickness that varies according to a diametral direction of the ring-shaped body.

Referring to FIG. 6, the upper surface 621 of the upper sealing member 62 may be disposed on an inclined surface having an upward inclination with respect to the ground. For example, the upper sealing member 62 may have a cylindrical shape in which the upper surface 621 is inclined upward with respect to the ground. One side (e.g. the left side in the drawing) of the upper sealing member 62 may have a vertical section that is outwardly inclined downward as the vertical section of the upper sealing member 62 disposed on the left side of FIG. 5. In the vertical section of the upper sealing member 62, a height h1 of the outer side surface 623 may be lower than a height h2 of the inner side surface 624. The other side (e.g. the right side in the drawing) of the upper sealing member 62 may have a vertical section that is outwardly inclined in an upward direction. In the vertical section of the upper sealing member 62, a height h3 of the inner side surface 624 may be lower than a height h4 of the outer side surface 623. For example, the upper sealing member 62 may have a thickness that varies along a circumferential direction of the ring-shaped body.

In the above-described exemplary embodiment, the upper surfaces 621 of the upper sealing member 62 positioned on opposite sides in the cross section taken in the first reference plane are disposed on an inclined line or an inclined surface that has only an upward inclination with respect to the ground. However, exemplary embodiments of the present disclosure are not limited thereto. For example, the upper surfaces 621 of the upper sealing member 62, which are opposite to each other on the first reference plane, may be on an inclined curved line. Also, the upper surfaces 621 of the upper sealing member 62 opposite to each other may be disposed on an inclined surface or an inclined curved surface having upward and downward inclinations with respect to the ground. For example, the inclined curved surface may be a curved surface whose center of curvature is not positioned on an internal-diameter center axis of the upper sealing member 62.

Figure 7:
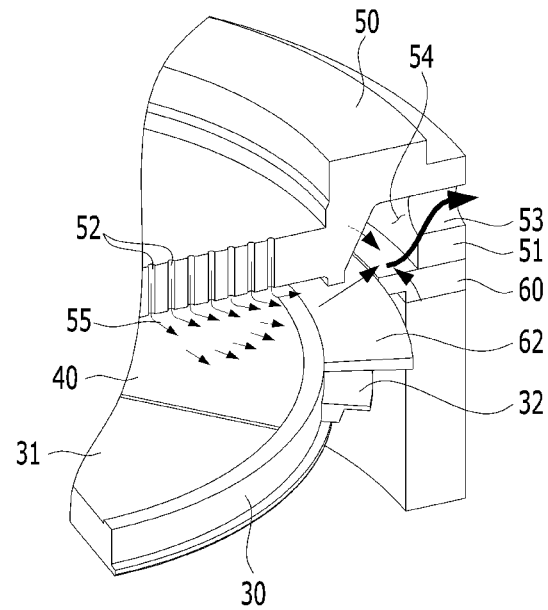
FIG. 7 is an enlarged perspective view corresponding to portion B of FIG. 2 and FIG. 4.
Figure 8:
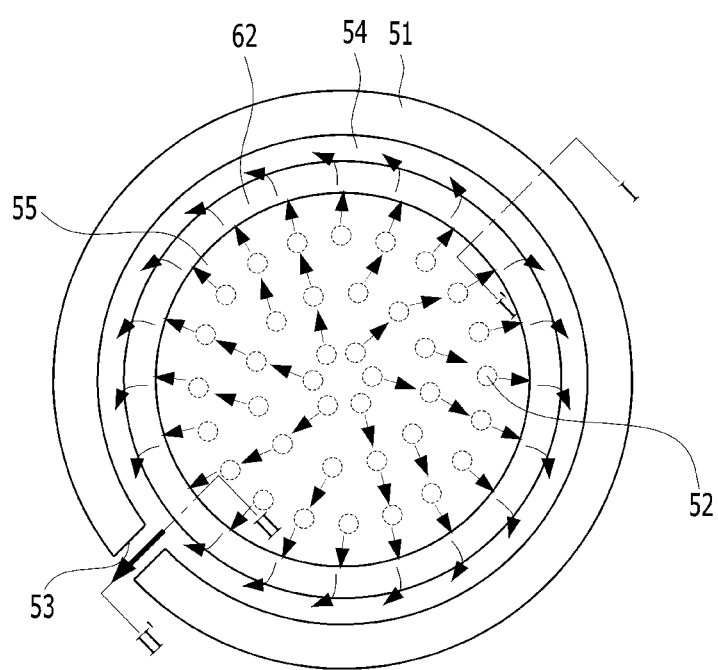
FIG. 8 is a horizontal cross-sectional view illustrating a substrate processing apparatus according to an exemplary embodiment of the present disclosure.
Figure 9:
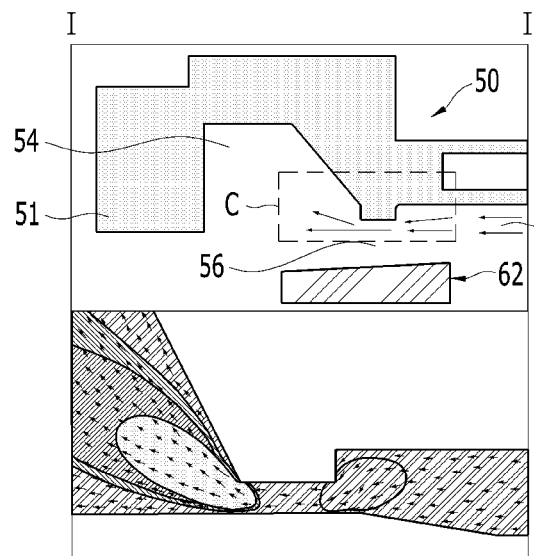
FIG. 9 is a cross-sectional view taken along line I-I' of FIG. 8 and a diagram of exhaust flow.
Figure 10:
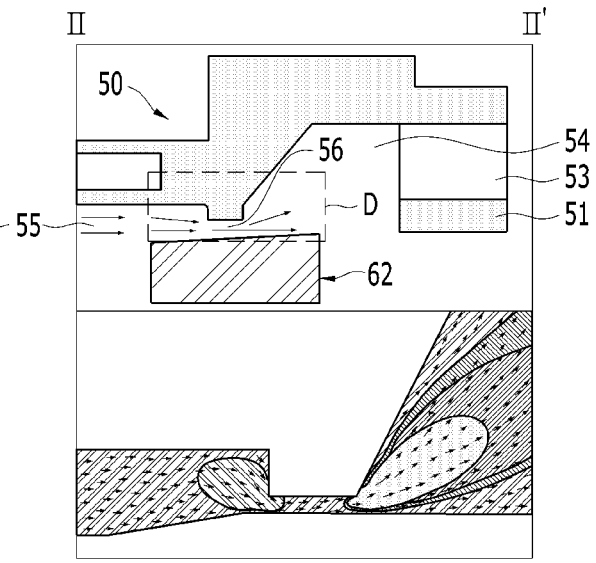
FIG. 10 is a cross-sectional view taken along line II-II' of FIG. 8 and a diagram of exhaust flow.
Figure 11:
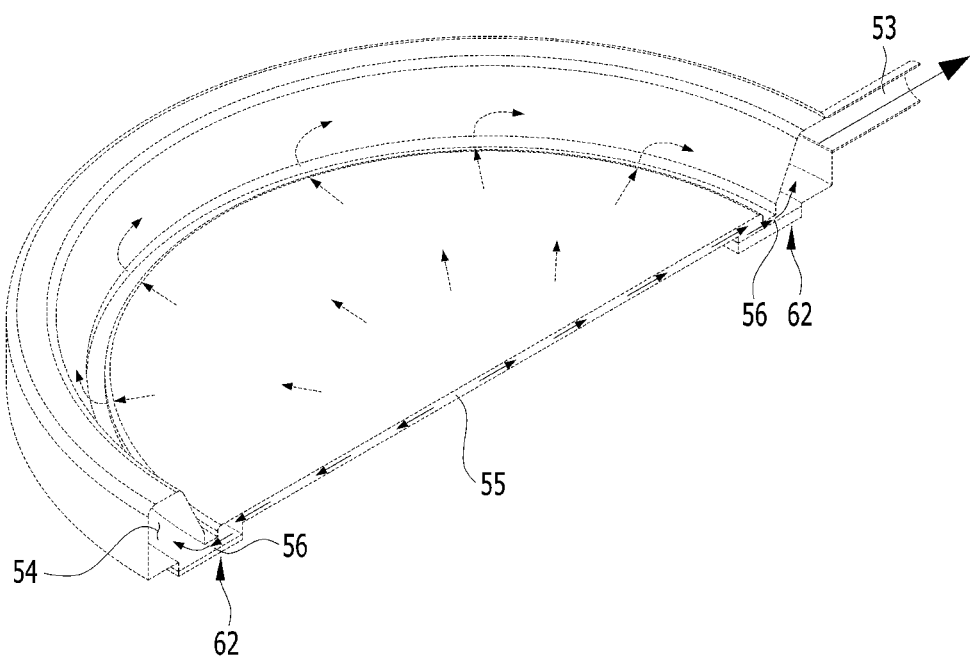
FIG. 11 is a perspective cross-sectional view illustrating an exhaust passage of a substrate processing apparatus according to an exemplary embodiment of the present disclosure.

FIG. 7 is an enlarged perspective view corresponding to portion B of FIG. 2 and FIG. 4. FIG. 8 is a horizontal cross-sectional view of a substrate processing apparatus according to an exemplary embodiment of the present disclosure. FIG. 9 is a cross-sectional view taken along line I-I' of FIG. 8, and FIG. 10 is a cross-sectional view taken along line II-II' of FIG. 8. FIG. 11 is a perspective cross-sectional view of an exhaust passage of a substrate processing apparatus according to an exemplary embodiment of the present disclosure.

Referring to FIG. 7, the process gas may be sprayed onto the reaction region 55 through the spray holes 52 of the gas distribution plate 50. An upper portion of the substrate 40, which defines a lower portion of the reaction region 55, may be processed by the process gas sprayed to the reaction region 55. The process gas may be moved from the reaction region 55 to the exhaust passage 54 via the gap 56 formed on the upper sealing member 62 after the processing is complete. Since the gap 56 is present along an edge of the reaction region 55, the process gas may flow radially. The process gas may be moved toward the exhaust port 53 along the exhaust passage 54 and may be discharged through the exhaust port 53.

Referring to FIG. 8, the chamber wall 51 of the upper chamber 10 may have a cylindrical shape, and the exhaust port 53 may be disposed on one side thereof. Inside the chamber wall 51, the upper sealing member 62 may be spaced apart in a ring shape that is concentric with the chamber wall 51. Inside the upper sealing member 62, the reaction region 55 may be formed. The space between the upper sealing member 62 and the chamber wall 51 may be the exhaust passage 54.

The process gas sprayed to the reaction region 55 or plasma generated in the reaction region 55 may be moved to the exhaust passage 54 via the gap 56 formed on the upper sealing member 62. The substrate 40, which is a processing target, may be disposed in the reaction region 55. In the reaction region 55, the process gas or the plasma may flow toward the exhaust passage 54 due to exhaust flow generated in the exhaust passage 54. The process gas moved to the exhaust passage 54 may be discharged to the outside of the vacuum chamber 1 via the exhaust port 53 along with the exhaust flow. Speed and amount of exhaust flow generated in the exhaust passage 54 may be affected by a distance from the exhaust port 53.

Referring to FIG. 9, exhaust flow generated in the exhaust passage 54 disposed on the opposite side of the exhaust port 53 may have a lower speed than exhaust flow generated around the exhaust port 53. The gap 56 between the upper surface 621 of the upper sealing member 62 and the lower surface of the gas distribution plate 50 may widen outwardly. For example, a cross section of the upper sealing member 62 disposed on the opposite side of the exhaust port 53 may be downwardly inclined in an outward direction. In comparison to a case in which the width of the gap 56 is uniform between the inner side and the outer side, an amount of process gas moving from the reaction region 55 to the exhaust port 53 may increase per unit time and unit area.

Referring to FIG. 10, exhaust flow generated in the exhaust passage 54 disposed on the side of the exhaust port 53 may have a higher speed than exhaust flow generated at a position apart from the exhaust port 53. The gap 56 between the upper surface 621 of the upper sealing member 62 and the lower surface of the gas distribution plate 50 may narrow outwardly. For example, a cross section of the upper sealing member 62 disposed on the side of the exhaust port 53 may be outwardly inclined in an upward direction. In comparison to a case in which the width of the gap 56 is uniform between the inner side and the outer side, an amount of process gas moving from the reaction region 55 to the exhaust port 53 per unit time and unit area may decrease.

The flow of the process gas at portion C and portion D of FIGS. 9 and 10, respectively, are shown in the bottom parts of FIGS. 9 and 10. Referring to portion C and portion D, although gaps between the upper sealing member 62 and the gas distribution plate 50 differ from each other, nearly identical flows of process gas may be generated. For example, regardless of the distance from the exhaust port 53, the process gas may be uniformly present in the reaction region 55. Diffusion around the edge of the substrate 40 may be increased so as to reduce asymmetry of the substrate processing result.

Referring to FIG. 11, on the side of the exhaust passage 54 close to the exhaust port 53, the upper surface of the upper sealing member 62 is relatively high such that the gap 56 may be narrow. On the side of the exhaust passage 54 farthest from the exhaust port 53, the upper surface of the upper sealing member 62 is relatively low such that the gap 56 may be wide. The width of the gap 56 may vary according to a positional relationship with the exhaust port 53 in the exhaust passage 54. When the width of the gap 56 varies, the flow of process gas passing through the gap 56 may vary. As shown in the drawings, exhaust flow of the process gas on the left side of a cross section may be depicted by solid arrows on the exhaust passage 54. The exhaust flow of the process gas may increase clockwise from a portion of the cross section farthest from the exhaust port 53, and the increase may be depicted in the drawings by the lengths of the arrows. On the rightmost portion of the cross section, an exhaust pressure from the exhaust port 53 is the highest, and thus exhaust flow may be the largest. According to an exemplary embodiment of the present disclosure, it is possible to compensate for a difference in exhaust flow with a difference in the gap 56.

FIGS. 12, 14, 16, 19, 20, and 23 are cross-sectional views of ring assemblies according to exemplary embodiments of the present disclosure, and FIGS. 13, 15, 17, 18, 21, 22, and 24 show perspective views and enlarged partial views of upper sealing members according to exemplary embodiments of the present disclosure.

Figure 12:
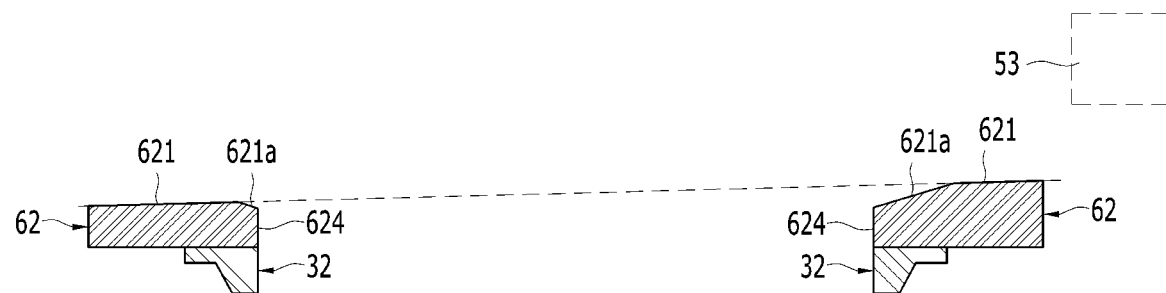
FIGS. 12, 14, 16, 19, 20, and 23 are cross-sectional views illustrating ring assemblies according to exemplary embodiments of the present disclosure.

Referring to FIG. 12, a taper 621*a* may be formed between the upper surface 621 and the inner side surface 624 of the upper sealing member 62. Components other than the taper 621*a* may be at least similar to corresponding components shown in the cross-sectional view of the ring assembly of FIG. 5 obtained by combining the upper sealing member 62 and the lower sealing member 32.

Figure 13:
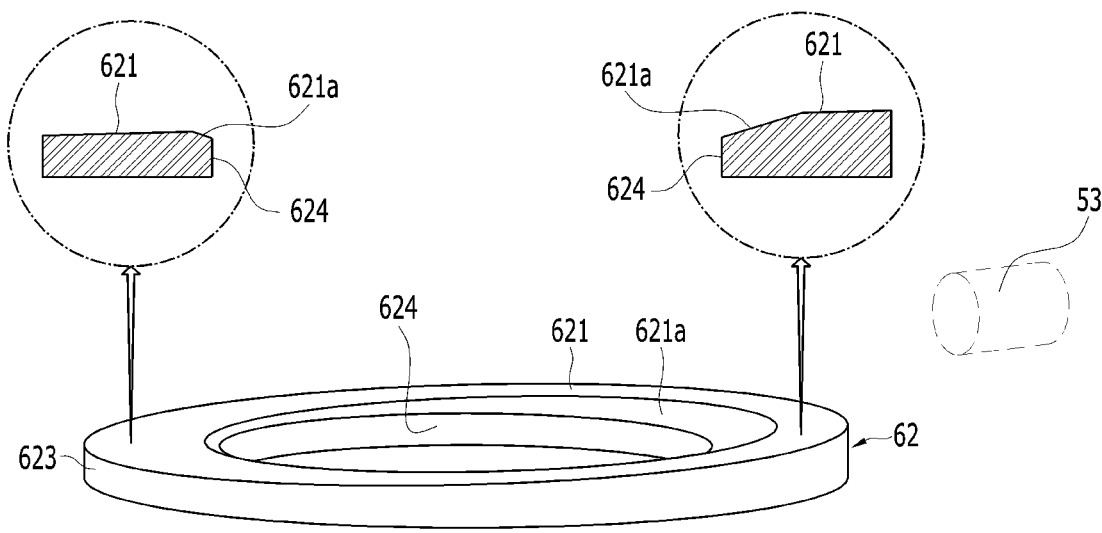
FIGS. 13, 15, 17, 18, 21, 22, and 24 are perspective views and enlarged partial views illustrating upper sealing members according to exemplary embodiments of the present disclosure.

Referring to FIG. 13, the taper 621*a* may be formed by chamfering the upper surface 621 of the upper sealing member 62 so that the upper sealing member 62 tapers downward to the inner side surface 624 of the upper sealing member 62. For example, the taper 621a may be a part of a downward conical surface that is concentric with the upper sealing member 62. In a cross section of the upper sealing member 62 positioned on opposite sides taken in the first reference plane, lengths of the upper surface 621 and the taper 621a may vary due to a difference in the height of the upper surface 621. The taper 621a of the upper sealing member 62 positioned on the left side in the drawing and the taper 621a of the upper sealing member 62 positioned on the right side may have the same inclination angle with respect to a horizontal plane but may have different lengths and depths. The taper 621a may be curved. For example, the taper 621a may be formed by rounding a corner at which the upper surface 621 and the inner side surface 624 of the upper sealing member 62 meet together. The chamfer may have a convex or concave shape.

In an exemplary embodiment of the present disclosure, the shapes of the upper sealing member 62 and the lower sealing member 32 may be changed while maintaining the inclination of the upper surface 621 in a cross section of the upper sealing member 62.

Figure 14:
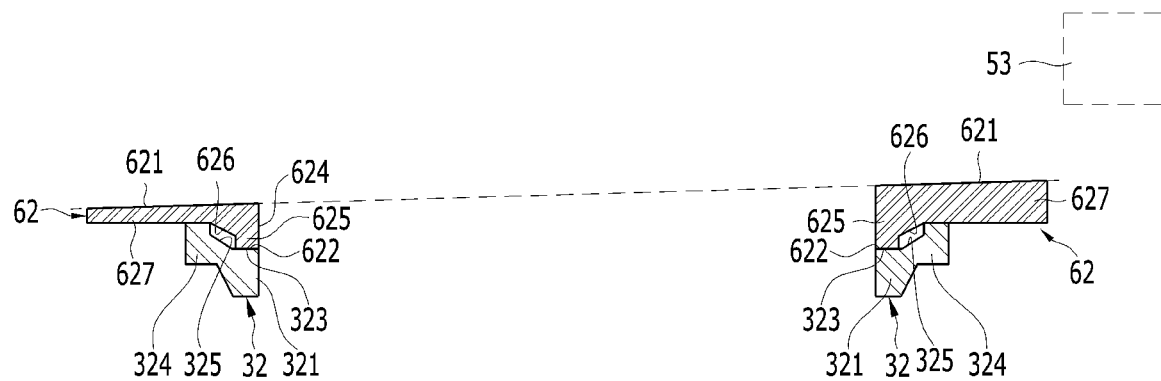

Referring to FIG. 14, the upper sealing member 62 may have a cross section including a support 625 disposed on the lower sealing member 32 and an extension 627 protruding out from the support 625. An inclination 626 may be formed at a corner between the support 625 and the extension 627 of the upper sealing member 62. The width of the gap 56 for forming the exhaust passage 54 may be determined by an upper surface of the extension 627 of the upper sealing member 62. When the exhaust port 53 is disposed on the right side in the drawing, the extension 627 on the right side may have an upward inclination in an outwardly direction.

The lower sealing member 32 may have a cross section including the support 321 and an extension 324 protruding out from the support 321. An outer end of the extension 324 may protrude upward. An inclination 325 may be formed at a corner between an upper surface 323 of the support 321 and the extension 324 of the lower sealing member 32. The outer end of the extension 324 of the lower sealing member 32 may support a lower surface of the extension 627 of the upper sealing member 62. The upper surface 323 of the support 321 of the lower sealing member 32 may support the lower surface 622 of the support 625 of the upper sealing member 62.

Figure 15:
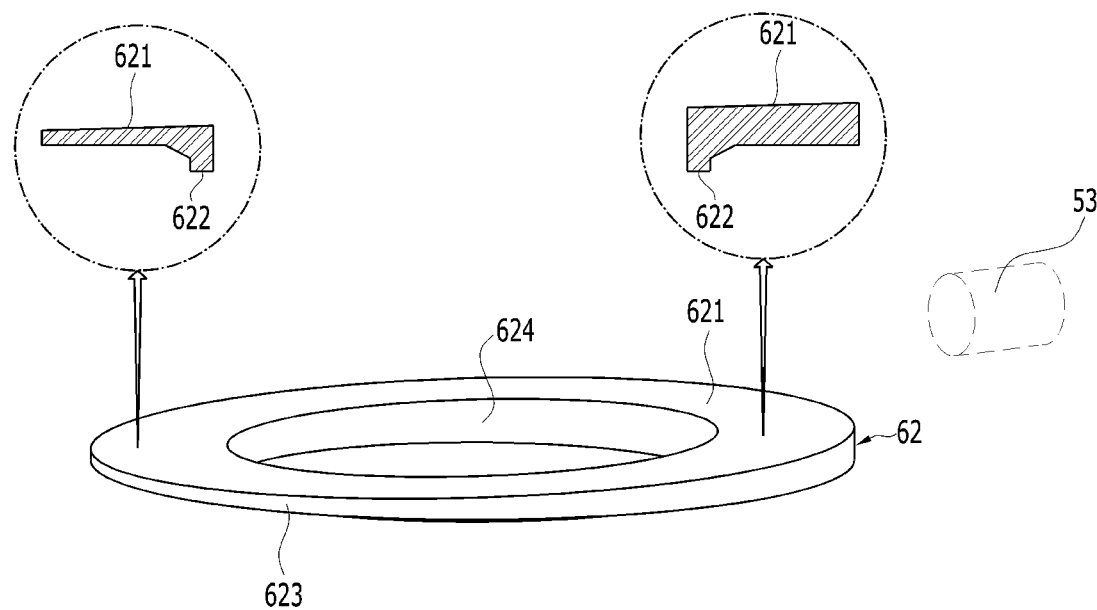

Referring to FIG. 15, the extension 627 of the upper sealing member 62 positioned on the left side in the drawing may have a cross section that is outwardly inclined downward. The extension 627 of the upper sealing member 62 positioned on the right side may have a cross section that is inclined upward in an outwardly direction. The extensions 627 of the upper sealing member 62 positioned on the left and right sides of the drawing may be formed to different thicknesses.

Figure 16:
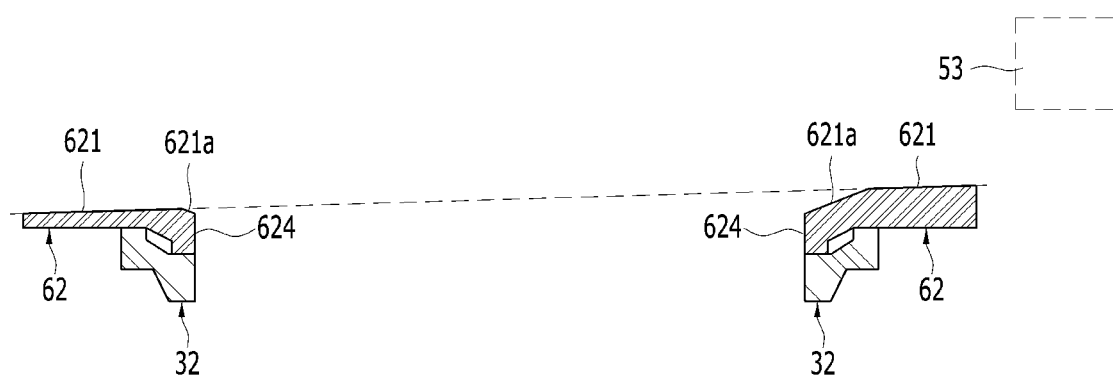
Figure 17:
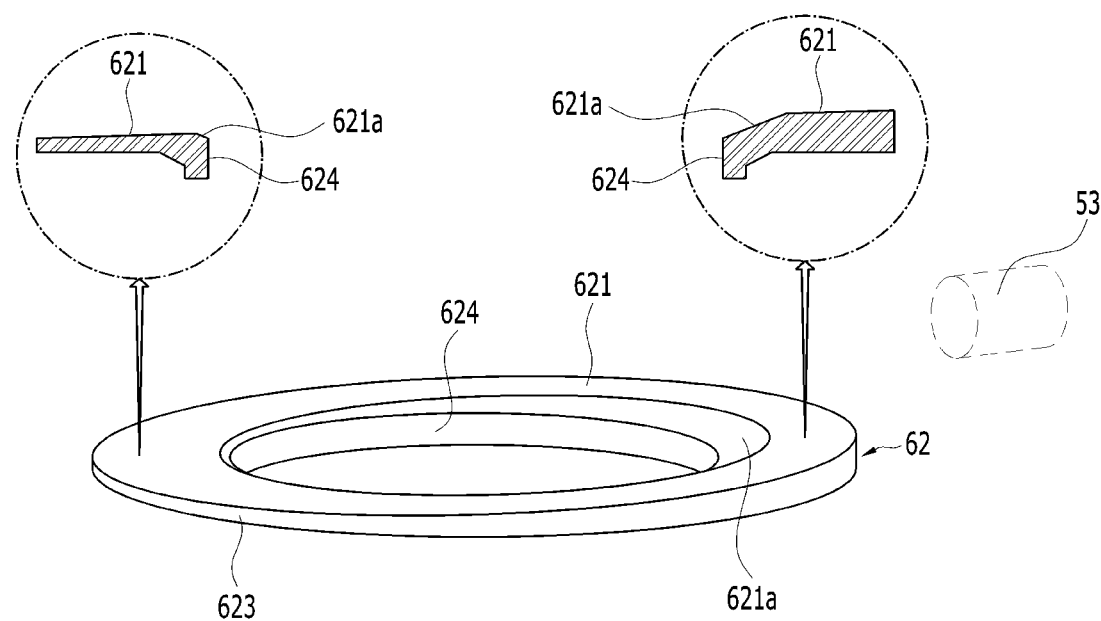

Referring to FIGS. 16 and 17, a taper 621a may be formed between the upper surface 621 and the inner side surface 624 of the upper sealing member 62. The components other than the taper 621a may be at least similar to corresponding elements shown in the cross-sectional view of the ring assembly of FIG. 14 obtained by combining the upper sealing member 62 and the lower sealing member 32 and those shown in the perspective view of the upper sealing member 62 of FIG. 15.

In an exemplary embodiment of the present disclosure, a plurality of exhaust ports 53 may be formed. One pair of exhaust ports 53 may be formed at opposite positions in the chamber wall 51. When respective vacuum pumps are connected to the exhaust ports 53, the speed of exhaust flow generated at a position close to an exhaust port 53 in the exhaust passage 54 by an exhaust pressure from the exhaust port 53 may be higher than the speeds of exhaust flow generated at other positions.

Figure 18:
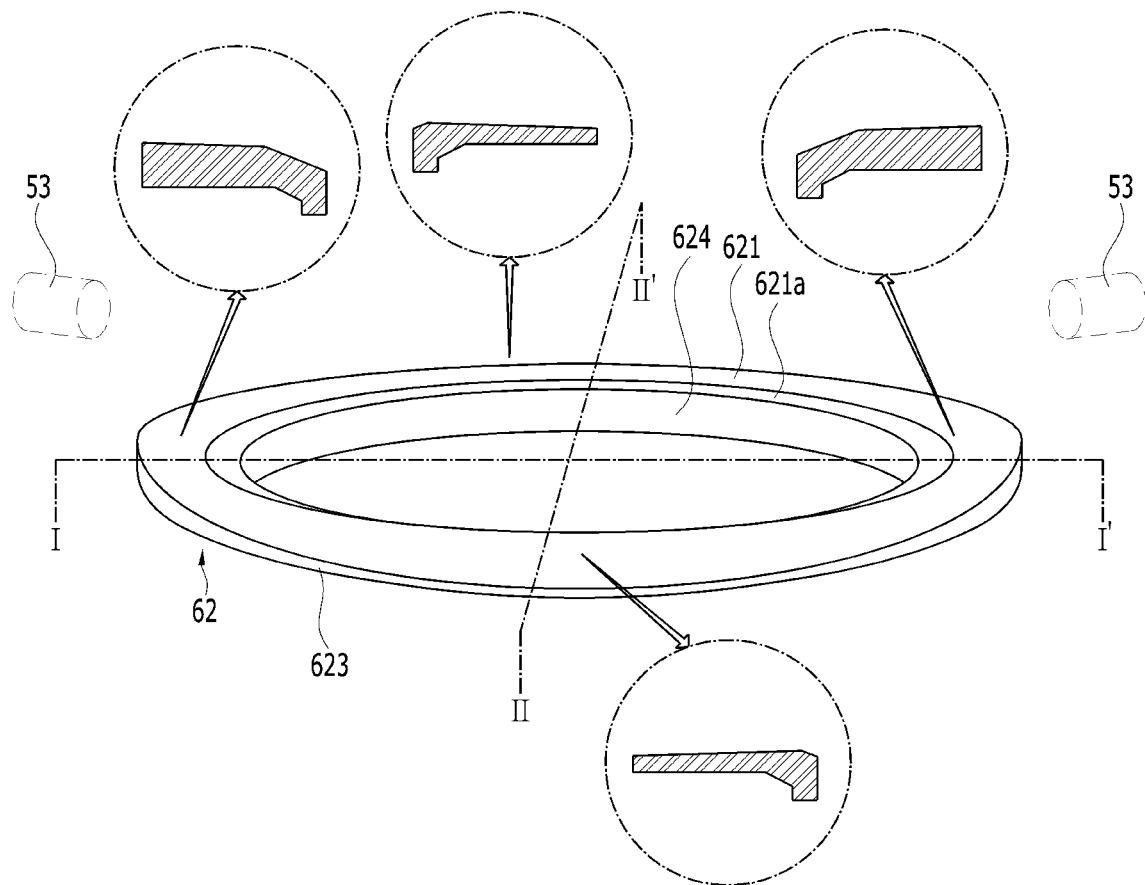
Figure 19:
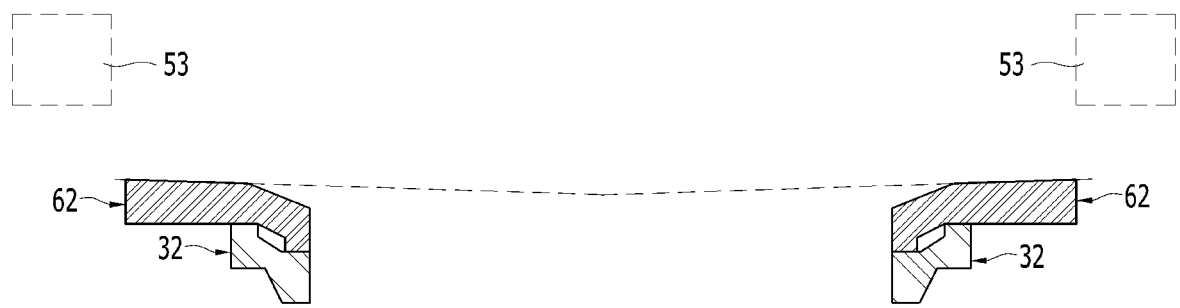
Figure 20:
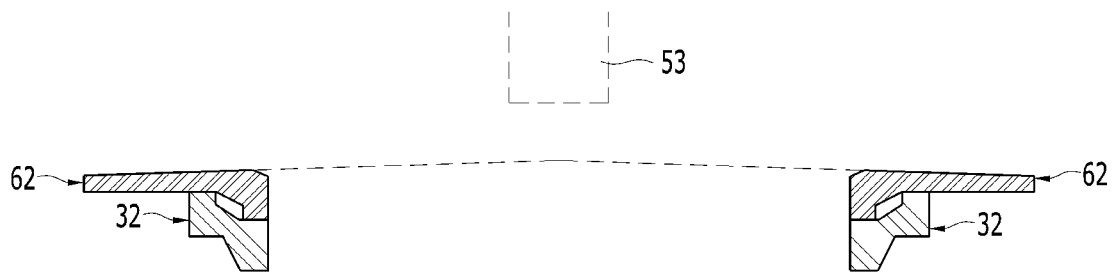

FIG. 18 is a perspective view and enlarged partial views illustrating an upper sealing member according to an exemplary embodiment of the present disclosure, and FIGS. 19 and 20 are cross-sectional views illustrating a ring assembly taken along line I-I' and line II-II' of FIG. 18, respectively.

Referring to FIG. 18, two exhaust ports 53 may be formed at opposite positions. When respective vacuum pumps are connected to the exhaust ports 53, exhaust pressures generated by the respective exhaust ports 53 may be nearly identical in the exhaust passage 54. The reference plane may be a second reference plane that includes the pair of exhaust ports 53 disposed at the opposite positions and is perpendicular to the ground. The second reference plane corresponds to a cross section taken along line I-I' of FIG. 18.

Cross-sectional parts of the upper sealing member 62 taken in the second reference plane are separately disposed close to the exhaust ports 53. Here, the distance from the exhaust ports 53 may be relative. A strong exhaust pressure generated around the exhaust ports 53 may be canceled out by narrowing the gap 56 of the exhaust passage 54. To narrow the gap 56, the upper surface 621 of the upper sealing member 62 positioned close to the exhaust ports 53 may be relatively high.

A plane perpendicular to the second reference plane and the ground is referred to as a third reference plane. The third reference plane corresponds to a cross section taken along line II-II' of FIG. 18. Cross-sectional parts of the upper sealing member 62 taken in the third reference plane may be disposed farthest from the exhaust ports 53. Since an exhaust pressure is relatively low at a position farthest from the exhaust ports 53, it is possible to increase the amount of exhausted process gas by widening the gap 56. The upper surface 621 of the upper sealing member 62 positioned farthest from the exhaust ports 53 may be relatively low.

Referring to FIGS. 19 and 20, a cross-sectional shape of the upper sealing member 62 may be symmetrical with respect to the second reference plane and the third reference plane. The upper surface 621 of the upper sealing member 62 may be inclined. When the upper surface 621 of the upper sealing member 62 is formed to have a first upward inclination in an outward direction, the gap 56 between the upper surface 621 of the upper sealing member 62 and the gas distribution plate 50 may be narrowed. Although not shown in the drawing, the upper surface 621 of the upper sealing member 62 positioned farthest from the exhaust ports (53) may be formed on a plane of the substrate processing apparatus to have a downward inclination in an outward direction or to have a second upward inclination which is lower than the first upward inclination.

Figure 21:
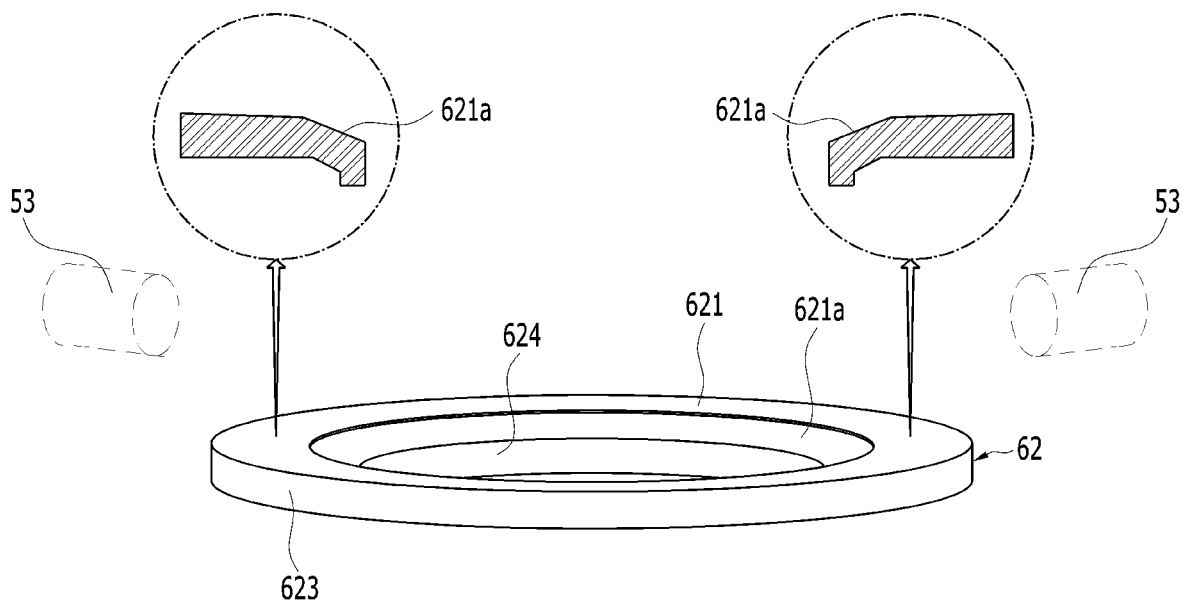
Figure 22:
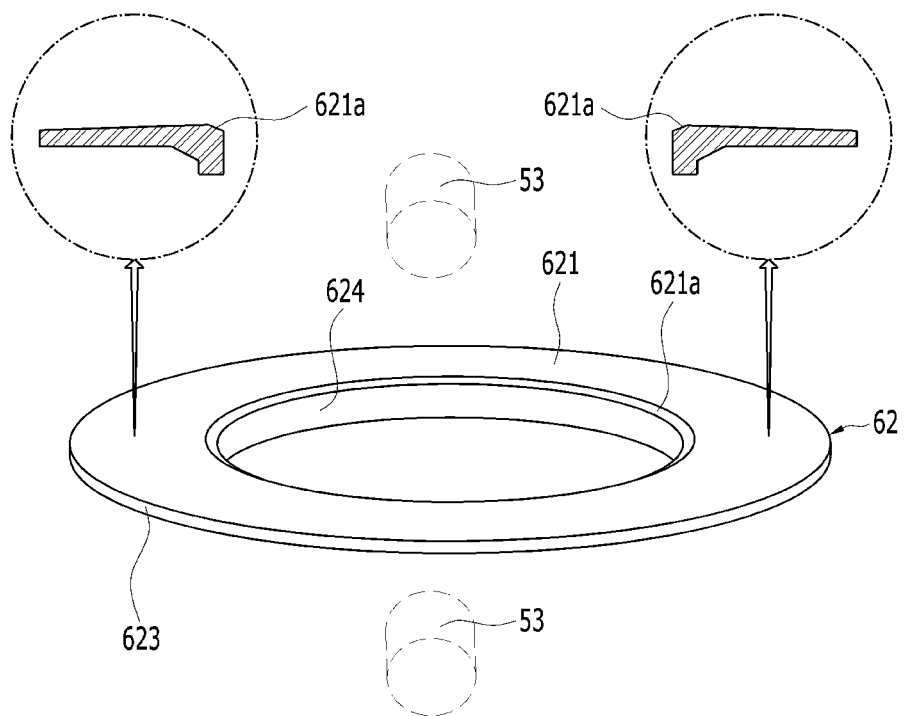

Referring to FIGS. 21 and 22, a cross-sectional shape of the upper sealing member 62 may vary according to a positional relationship of the upper sealing member 62 with the exhaust port 53, such as a distance from the exhaust port 53, the number of exhaust ports 53, a position at which the exhaust port 53 is disposed, and the like. Substrate processing results may be changed by an amount or a residence time of process gas passing through a specific position or area in the exhaust passage 54.

The upper surface 621 of the upper sealing member 62, according to an exemplary embodiment of the present disclosure, may vary according to a distance from the exhaust port 53 in the exhaust passage 54. For example, when a height of the upper surface 621 of the upper sealing member 62 disposed close to the exhaust port 53 is a first height and a height of the upper surface 621 of the upper sealing member 62 disposed farther from the exhaust port 53 is a second height, the first height may be higher than the second height. A third height, which is a height of the upper surface 621 of the upper sealing member 62 between the first height and the second height, may continuously increase or decrease between the first height and the second height. For example, the upper sealing member 62 might not have uniform thickness. The width of the gap 56 between the upper surface 621 of the upper sealing member 62 and the gas distribution plate 50 may vary. The upper sealing member 62 may have a thickness of 3 mm or more at the thinnest portion and a thickness of 100 mm or less at the thickest portion. The thickness of the upper sealing member 62 from the thinnest portion to the thickest portion may be continuous and asymmetrical with respect to the reference plane. A difference in thickness between the thickest portion and the thinnest portion may be 0.5 mm or more. The shape and size of the upper sealing member 62 are not limited to the above description, and may be appropriately selected according to a shape, size, process, etc. of the substrate processing apparatus.

In an exemplary embodiment of the present disclosure, the speed of exhaust flow on a side close to the exhaust port 53 may be lower than that of exhaust flow on a side farthest from the exhaust port 53. An exhaust speed of the process gas may be affected by characteristics, such as a type of the process gas, a state of the process gas, a material of the upper sealing member 62, a type of a substrate processing operation, and the like.

Figure 23:
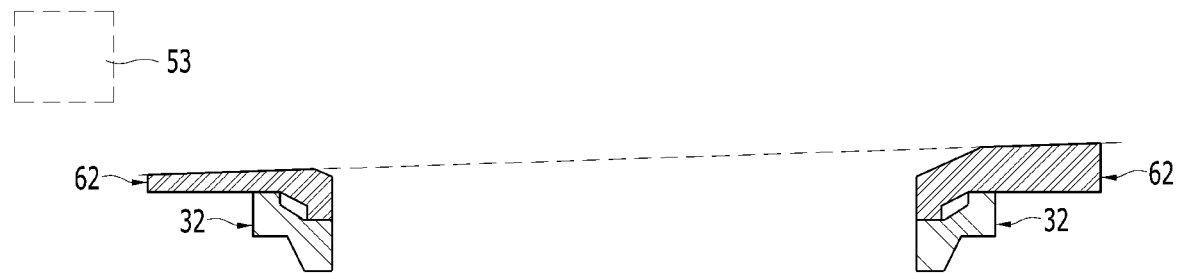
Figure 24:
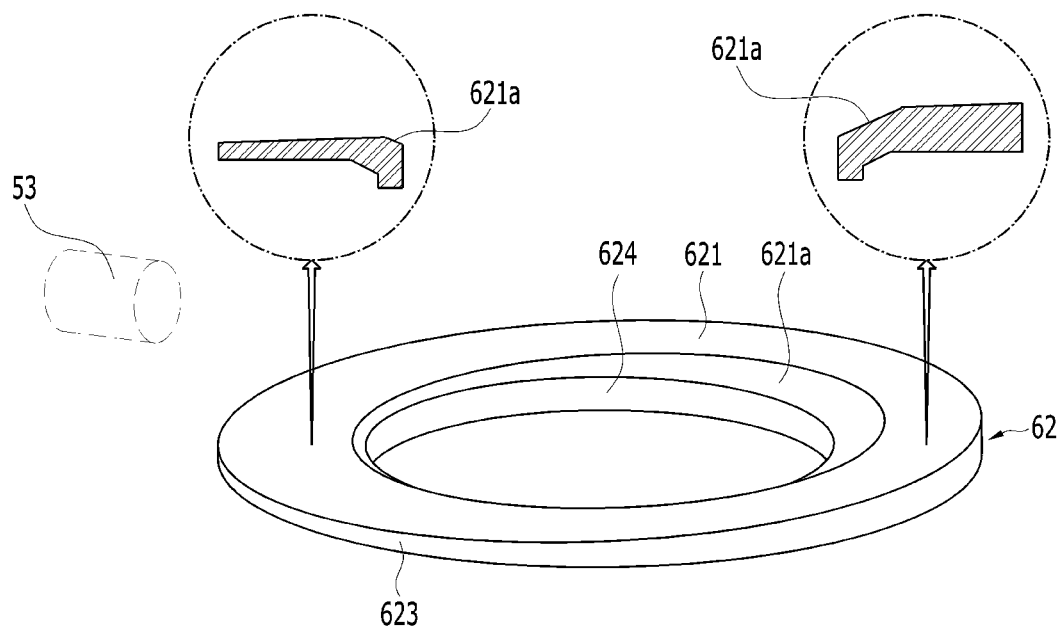

FIG. 23 is a cross-sectional view of a ring assembly according to an exemplary embodiment of the present disclosure, and FIG. 24 shows a perspective view and enlarged partial views of an upper sealing member of FIG. 23.

Referring to FIGS. 23 and 24, in contrast to FIGS. 16 and 17, the gap 56 between the upper surface 621 of the upper sealing member 62 and the gas distribution plate 50 may be widened on a side close to the exhaust port 53. Since the upper sealing member 62 of FIGS. 23 and 24 is the same as that of FIGS. 16 and 17 except that a position of the exhaust port 53 is moved to the left in the drawing, it may be assumed that omitted details are at least similar to the details provided above with respect to corresponding elements. When the process gas used for substrate processing has low reactivity, a process temperature is low, or a process pressure is low, the upper sealing member 62 closer to the exhaust port 53 may be formed thinner.

Figure 25:
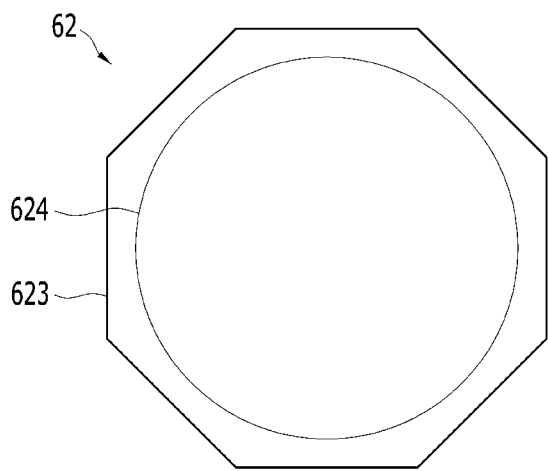
FIGS. 25 and 26 are plan views illustrating upper sealing members according to exemplary embodiments of the present disclosure.
Figure 26:
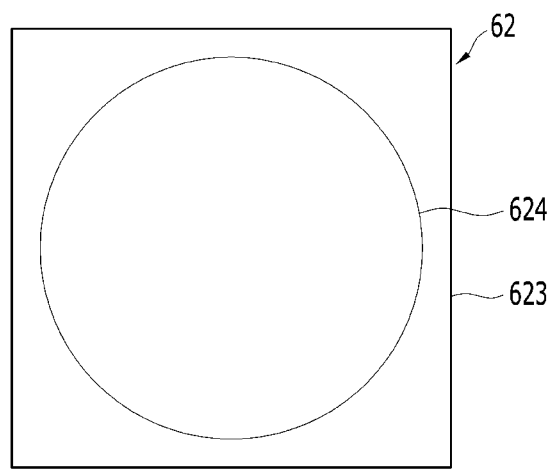

FIGS. 25 and 26 are plan views of the upper sealing member 62 according to exemplary embodiments of the present disclosure.

Referring to FIGS. 25 and 26, the inner side surface 624 of the upper sealing member 62 may have a cylindrical shape corresponding to a circumferential surface of the substrate supporting device 30. The outer surface 623 of the upper sealing member 62 may have a polygonal barrel shape, such as a cylindrical shape, an elliptical barrel shape, an octagonal barrel shape, and a rectangular barrel shape, as a shape corresponding to the support plate 60. For example, the outer surface 623 may have a circular shape, an oval shape, or a polygonal shape in the shown plan views.

A lower surface shape of the exhaust passage 54 may vary in radial directions from the center of the upper sealing member 62 according to a distance between the inner side surface 624 and the outer side surface 623. For example, when the distance between the outer side surface 623 and the inner side surface 624 is large, a part of a lower surface of the exhaust passage 54 may increase in depth in comparison to other positions, and a cross-sectional area of the exhaust passage 54 may increase. When the cross-sectional area of the exhaust passage 54 increases, the amount of process gas moving from the reaction region 55 to the exhaust passage 54 via the gap 56 may increase. When the amount of process gas passing through a certain area on a circumferential surface of the reaction region 55 per unit time increases, an exhaust speed of the process gas may increase, compared to exhaust speeds at other positions. Due to the shape of the outer side surface 623 of the upper sealing member 62, a speed of exhaust flow of the process gas may be controlled.

According to the exemplary embodiments of the present disclosure, asymmetry of process gas exhaust flow of a substrate processing apparatus may be reduced.

According to the exemplary embodiments of the present disclosure, unevenness of a substrate processing result may be reduced for processes such as deposition, etching, annealing, etc.

Although the exemplary embodiments of the present disclosure have been described with reference to the accompanying drawings, those of ordinary skill in the art to which the present disclosure pertains would appreciate that the present disclosure may be implemented in other concrete forms without departing from the technical spirit and essential features thereof.

What is claimed is:

1. A substrate processing method, comprising:
spraying a process gas into a reaction region between a gas distribution plate and a substrate;
processing the substrate with the process gas;
discharging the process gas from the reaction region into an exhaust passage through a ring-shaped gap between the gas distribution plate and an upper seal, the ring-shaped gap having a first width and a second width; and
discharging the process gas from the exhaust passage into an outside through an exhaust port,
wherein a distance between the first width and the exhaust port is less than a distance between the second width and the exhaust port,
wherein the first width has an inner width and an outer width smaller than the inner width, and
wherein the second width has an outer width and an inner width smaller than the outer width.

2. The substrate processing method of claim 1, wherein an amount of the process gas discharging through the first width is substantially equal to an amount of the process gas discharging through the second width.

3. The substrate processing method of claim 1, wherein the discharging the process gas from the reaction region into the exhaust passage comprises:
discharging the process gas so that the process gas is uniformly present in the reaction region.

4. The substrate processing method of claim 1, wherein a ate at which the process gas discharges through the first width is substantially equal to a rate at which the process gas discharges through the second width.

5. The substrate processing method of claim 1, wherein a thickness of the upper seal decreases from the first width to the second width.

6. The substrate processing method of claim 1, wherein an amount of the process gas discharging from a portion of the exhaust passage adjacent to the first width is greater than an amount of the process gas discharging from a portion of the exhaust passage adjacent to the second width.

7. A substrate processing method, comprising:
spraying a process gas into a reaction region between a gas distribution plate and a substrate;
processing the substrate with the process gas;
discharging the process gas from the reaction region into an exhaust passage through a ring-shaped gap between the gas distribution plate and an upper seal, the ring-shaped gap having a first width and a second width; and
discharging the process gas from the exhaust passage into an outside through an exhaust port,
wherein a distance between the first width and the exhaust port is less than a distance between the second width and the exhaust port,
wherein the first width becomes narrower as it approaches the exhaust passage, and
wherein the second width becomes wider as it approaches the exhaust passage.

8. The substrate processing method of claim 7, wherein an amount and rate of the process gas discharging through the first width is substantially equal to an amount and rate of the process gas discharging through the second width.

9. The substrate processing method of claim 7, wherein the discharging the process gas from the reaction region into the exhaust passage comprises:
discharging the process gas so that the process gas is uniformly present in the reaction region.

10. The substrate processing method of claim 7, wherein a rate at which the process gas passes from a portion of the exhaust passage adjacent to the first width is greater than a rate at which the process gas passes from a portion of the exhaust passage adjacent to the second width.

11. The substrate processing method of claim 7, wherein the process gas is converted into plasma in the reaction region.

12. The substrate processing method of claim 7, wherein the discharging the process gas from the reaction region into the exhaust passage comprises:
discharging the process gas radially.

13. The substrate processing method of claim 7, wherein a flow of the process gas through the first width is substantially equal to a flow of the process gas through the second width.

14. A substrate processing method, comprising:
spraying a process gas into a reaction region between a gas distribution plate and a substrate;
processing the substrate with the process gas;
discharging the process gas from the reaction region into an exhaust passage through a ring-shaped gap between the gas distribution plate and an upper seal, the ring-shaped gap having a first width and a second width; and
discharging the process gas from the exhaust passage into an outside through an exhaust port,
wherein a distance between the first width and the exhaust port is less than a distance between the second width and the exhaust port,
wherein a rate at which the process gas discharges through the first width is substantially equal to a rate at which the process gas discharges through the second width,
wherein a rate at which the process gas passes from a portion of the exhaust passage adjacent to the first width is greater than a rate at which the process gas passes from a portion of the exhaust passage adjacent to the second width,
wherein a width of the ring-shaped gap becomes narrower as it approaches the exhaust passage from the first width, and
wherein a width of the ring-shaped gap becomes wider as it approaches the exhaust passage from the second width.

15. The substrate processing method of claim 14, wherein the first width and the second width are disposed opposite to each other.

16. The substrate processing method of claim 14, wherein a thickness of the upper seal increases as it approaches the exhaust port.

* * * * *